(12) United States Patent
Sun et al.

(10) Patent No.: US 9,406,765 B1
(45) Date of Patent: Aug. 2, 2016

(54) HYBRID DIELECTRIC NON-VOLATILE MEMORY WITH NANO PARTICLES (SI/SIO$_2$ CORE/SHELL) AS CHARGE TRAPPING LAYER

(71) Applicant: Nano and Advanced Materials Institute Limited, Hong Kong (HK)

(72) Inventors: Caiming Sun, Hong Kong (HK); Chun Zhao, Hong Kong (HK); Ka Chon Wong, Hong Kong (HK)

(73) Assignee: NANO AND ADVANCED MATERIALS INSTITUTE LIMITED, Hong Kong (HK)

( * ) Notice: Subject to any disclaimer, the term of this patent is extended or adjusted under 35 U.S.C. 154(b) by 0 days.

(21) Appl. No.: 14/811,849

(22) Filed: Jul. 29, 2015

(51) Int. Cl.
*H01L 29/51* (2006.01)
*H01L 29/00* (2006.01)
*H01L 27/11* (2006.01)
*H01L 29/423* (2006.01)
*H01L 27/115* (2006.01)
*H01L 21/28* (2006.01)

(52) U.S. Cl.
CPC .... *H01L 29/42348* (2013.01); *H01L 21/28282* (2013.01); *H01L 27/11568* (2013.01); *H01L 29/513* (2013.01)

(58) Field of Classification Search
CPC ............ H01L 29/42348; H01L 29/513; H01L 27/11568
See application file for complete search history.

(56) References Cited

U.S. PATENT DOCUMENTS

| 7,592,618 B2 * | 9/2009 | Khang | C09K 11/02 257/103 |
| 8,748,968 B2 * | 6/2014 | Choi | B82Y 10/00 257/324 |
| 8,815,683 B2 * | 8/2014 | Kim | B82Y 10/00 257/24 |

(Continued)

FOREIGN PATENT DOCUMENTS

KR   20060076858 A   *   7/2006

OTHER PUBLICATIONS

Y. J. Park et al., Control of Thin Ferroelectric Polymer Films for Non-volatile Memory Applications, IEEE Trans on Dielectrics and Electrical Insulation 17(4), 1135-1163 (2010).

(Continued)

*Primary Examiner* — Ida M Soward
(74) *Attorney, Agent, or Firm* — Ella Cheong Hong Kong; Sam T. Yip

(57) ABSTRACT

Si/SiO$_2$ core/shell nanostructures with sizes below 30 nm as trapping points in UV curable hybrid organic-inorganic gate dielectrics are presented in order to investigate printable nano floating gate transistors. Not only does the novelty of this invention comes from fabricating high-quality hybrid organic/inorganic gate dielectric layer by Sol-Gel process at low temperature but also incorporating the monolayer of high-density of Si nanoparticles (NPs) without obvious interface defects and keeping the quality of dielectric layers. Fixed-charge trapping defects are successfully removed from hybrid dielectrics by UV curing together with low temperature thermal curing and mobile charges solely related to Si/SiO$_2$ core/shell nanostructures on charge trapping layer clearly demonstrate memory effects on printable device. Thin/uniform SiO$_2$ shell on each Si NP functions as tunneling layer of flash memory devices, significantly simplifying the fabrication of printable nano floating gate memory device.

20 Claims, 14 Drawing Sheets

(56) References Cited

U.S. PATENT DOCUMENTS

| | | | |
|---|---|---|---|
| 9,035,272 B2* | 5/2015 | Sheng | H01L 45/1608 257/1 |
| 2006/0097247 A1* | 5/2006 | Kim | B82Y 15/00 257/40 |
| 2015/0036234 A1* | 2/2015 | Ben-Yakar | H01L 31/054 359/885 |
| 2015/0108425 A1* | 4/2015 | Rosenman | H01L 29/0665 257/13 |

OTHER PUBLICATIONS

Robert Bez et al., Introduction to Flash Memory, Proceedings of the IEEE 91(4), Apr. 2003, 489-502.

Kim et al., Nonvolatile nano-floating gate memory devices based on pentacene semiconductors and organic tunneling insulator layers, Appl. Phys. Lett. 96, 033302 (2010).

T. Sekitani, Organic Nonvolatile Memory Transistors for Flexible Sensor Arrays, Science 326, 1516-1519 (2009).

C.C. Leu, S.T. Chen, F.K. Liu and C.X. Wu, Improved performance of nanocrystal memory for aminosilane-mediated Au—$SiO_2$ embedded core-shell nanoparticles, J. Mater. Chem. 22, 2089-2098 (2012).

B. Chandar Shekar, Jiyeon Lee and Shi-Woo Rhee, Organic Thin Film Transistors: Materials, Processes and Devices, Korean J. Chem. Eng., 21(1), 267-285 (2004).

C.Z. Zhao et al., Stress-Induced Positive Charge in Hf-Based Gate Dielectrics: Impact on Device Performance and a Framework for the Defect, IEEE Transactions on Electron Devices 55(7), 1647-1656 (2008).

June Whan Choi, Ho Gyu Yoon, Jai Kyeong Kim, OTFTs using hybrid films as gate dielectrics prepared via UV curing and sol-gel reaction, Organic Electronics 11, 1145-1148 (2010).

Jin-Yong Lee et al., Voltage-dependent resistive switching characteristics in mixed layer consisting of c—$Fe_2O_3$ and Pt—$Fe_2O_3$ core-shell nanoparticles, Appl. Phys. Lett. 104, 093514 (2014).

Ken Takeuchi, Novel Co-Design of NAND Flash Memory and NAND Flash Controller Circuits for Sub-30 nm Low-Power High-Speed Solid-State Drives (SSD), IEEE Journal of Solid-State Circuits, Vol. 44, No. 4, Apr. 2009, 1227-1234.

* cited by examiner

HYBRID DIELECTRIC NON-VOLATILE MEMORY WITH NANO PARTICLES (SI/SIO$_2$ CORE/SHELL) AS CHARGE TRAPPING LAYER

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to a printable non-volatile memory, and particularly relates to a method for preparing hybrid organic-inorganic dielectric layers for flash memory transistors by solution process at low temperature, and more particularly relates to a method for fabricating a non-volatile memory with nano particles as charge trapping layer.

BACKGROUND

The following references are cited in the specification. Disclosures of these references are incorporated herein by reference in their entirety.

LIST OF REFERENCES

[1]. Y. J. Park et al., IEEE Trans on Dielectrics and Electrical Insulation 17(4), 1135-1163 (2010)
[2]. Introduction to Flash Memory, PROCEEDINGS OF THE IEEE 91(4), APRIL 2003 [3]. Kim et al., Appl. Phys. Lett. 96, 033302 (2010)
[4]. T. Sekitani, Science 326, 1516-1519 (2009)
[5]. C. C. Leu, S. T. Chen, F. K. Liu and C. X. Wu, J. Mater. Chem. 22, 2089-2098 (2012)
[6]. B. Chandar Shekar, Jiyeon Lee and Shi-Woo Rhee, Korean J. Chem. Eng., 21(1), 267-285 (2004)
[7]. C. Z. Zhao et al., IEEE TRANSACTIONS ON ELECTRON DEVICES 55(7), 1647-1656 (2008)
[8]. June Whan Choi, Ho Gyu Yoon, Jai Kyeong Kim, Organic Electronics 11, 1145-1148 (2010)
[9]. Jin-Yong Lee et al., Appl. Phys. Lett. 104, 093514 (2014)

Electronic devices are traditionally fabricated using rigid semiconductors and high-temperature manufacturing method. In contrast, printed devices can be processed at low temperatures and on large-area polymeric substrates. Data storage is one key requirement in many electronic devices. Plenty of efforts have been spent on printed memory devices in order to realize large-area, flexible, and low-cost electronic devices. For example, ferroelectric (Fe) polymer, P(VDF-TrFE), was developed for electrical switching [1]. The electrical switching of Fe polymers, P(VDF-TrFE), requires a relatively large coercive field of ~MV/cm with thickness down to 100 nm, and the coercive field required to reverse the macroscopic polarization increases with decreasing film thickness. Thus, it is difficult to obtain large enough memory window with program and erase voltages below 20V, which is challenging printed memories for low-power applications. Therefore, these memory transistors based on Fe polymer are not compatible with commercial reading systems which operate under low power and low voltage [2].

In order to make nonvolatile memory transistors operated under low voltage (<10V) and be printable on flexible substrates, floating gate thin film transistors are developed with dielectric gate layer thin enough [3,4]. The charge leakage from the Au NPs (nano particles) floating gate can be suppressed by improving the NPs/dielectric interface with Au NPs spin-coated on 3-aminopropyltrimethoxysilane (APTMS)-modified SiO$_2$. Furthermore, a simple but effective self-assembly monolayer (SAM) method was used to construct an Au—SiO$_2$ core-shell NC capacitor by use of APTMS as a mediator [5]. But the process temperature for this memory device is higher than 400° C. and then this device is not able to be fabricated by printing techniques.

The significance of dielectric layer is attracting more and more interests in order to develop high-performance printable floating gate memory transistors. Many studies have tried to find better gate dielectrics with polymeric materials, inorganic/organic hybrids, inorganic/organic bilayers, and organic/inorganic hybrids via sol-gel reaction. In the case of a polymer dielectric film, one of the drawbacks is the high operating voltage in devices due to its thickness and low dielectric constant (PMMA 2.5-4.5, polyimide 2.6-3.3, Teflon 1.9), compared with inorganic dielectrics (Al$_2$O$_3$ 9 and Ta$_2$O$_5$ 26) [6]. To solve this problem, high-k inorganic materials such as Al$_2$O$_3$ and Ta$_2$O$_5$ had been used as gate insulators due to their dielectric constants which are much higher than those of polymers. But metal oxide has relatively high leakage current and these films can be produced with the vacuum techniques, such as chemical vapor deposition, sputtering or flame hydrolysis. Vacuum equipment is not suitable for a low temperature and low cost process required by printing techniques. Alternatively, high-k inorganic nanoparticles can be dispersed in polymer matrix. However, a nanocomposite dielectric layer with high-k NPs embedded in polymer matrix has a rough surface and high gate leakage current to have a low on/off current ratio. In addition, it is difficult to eliminate fixed-charge trapping defects generated by high-k NPs in dielectric layer. These fixed-charge associated trapping defects in dielectrics will become deadly shielding of preventing the mobile charging/discharging progress in memory transistors. The sol-gel derived siloxane based organic-inorganic hybrid materials (hybrimers) are nanocomposite materials in which inorganic and organic components are intimately linked at molecular scale by a covalent bond and nano-sized oligomers are well-dispersed. Since they combine the characteristics of both glass and polymers, it has low leakage current density and has potential chances of removing fixed-charge trapping defects in hybrid organic-inorganic dielectrics.

However, the memory behaviour and the production cost of the conventional technologies still fail to meet the need of the market.

Consequently, there is an unmet need to have a method for fabricating nonvolatile memory transistors being applicable for printed electronics with desirable memory behavior and low production cost.

SUMMARY OF THE INVENTION

To satisfy the requirements of manipulating the trap levels and trap sites for floating gate transistors, employment on nano-crystals floating gate is considered to be an alternative approach to replace the traditional planar floating gate for information storage. The present invention has focused on incorporating Si NPs as the charge storage elements in non-volatile memory devices. Nanoparticle-based memories benefit from reduced lateral discharge paths, and promise larger retention time, lower power consumption, and faster operation. Compared to metal NPs (Au, Ag, Al, etc.), applying Si nanocrystals as floating gate can remove metal contaminations in gate dielectrics, which is critical to reduce device leakage.

In the present invention, $Si/SiO_2$ core/shell nanostructures are used to work as trapping sites in floating gate memory. Uniform $SiO_2$ shell of 3 nm to 5 nm in thickness surrounding each Si NPs is formed by silicon cores simultaneously oxidized in solutions and it reduces lateral discharging with retention properties improved. More importantly, with monolayer of Si NPs trapping layers, this ultrathin/uniform $SiO_2$ shell functions as tunneling layer of flash memory devices and leads to quite low operation voltage for printable NPs floating-gate memory devices. Compared to traditional memory stacks (substrate/tunnel layer/charge trapping layer/control layer/gate electrode) [2, 3, 4 5], the present invention didn't involve separate tunnel layer, and the high-quality $SiO_2$ shell acts as tunnel layer.

Also hybrid organic/inorganic dielectrics layer is prepared by sol-gel method. With sol-gel formula optimized and curing conditions improved at low temperature, memory devices with this novel hybrid dielectrics show relatively low leakage current density and more importantly it is successful to remove fixed-charge associated trapping defects in dielectrics.

Accordingly, a first aspect of the presently claimed invention is to provide a printable floating gate transistor for non-volatile memory.

According to an embodiment of the presently claimed invention, a floating gate memory device comprises: a substrate; a charge trapping layer formed on the substrate, wherein the charge trapping layer comprises a hybrid organic/inorganic dielectric material and silicon/silicon dioxide (Si/$SiO_2$) core/shell nanostructures, and the $Si/SiO_2$ core/shell nanostructures are embedded within the hybrid organic/inorganic dielectric material; a hybrid organic/inorganic dielectric layer formed on the charge trapping layer; and a gate electrode formed on the hybrid organic/inorganic layer; and wherein each of the $Si/SiO_2$ core/shell nanostructures comprises a Si core enclosed by a $SiO_2$ shell acting as a tunnel layer for the floating gate memory device.

A second aspect of the presently claimed invention is to provide a method for fabricating a floating gate transistor.

According to an embodiment of the presently claimed invention, a method for fabricating a floating gate memory device comprises: providing a substrate; mixing silicon particles with a solution comprising an organic solvent and hydrogen peroxide to form a silicon/silicon dioxide (Si/$SiO_2$) core/shell nanostructures solution, wherein the silicon particles comprises a size of 10 nm to 50 nm; coating the $Si/SiO_2$ core/shell nanostructure solution on the substrate; drying the $Si/SiO_2$ core/shell nanostructure solution with a drying temperature in a range of 60° C. to 150° C. to form a charge trapping layer; mixing 3-methacryloxypropyltrimethoxysilane (MEMO), zirconium propoxide (ZrPO), methacrylic acid (MAA), and a photoinitiator to form a hybrid organic/inorganic dielectric solution, coating the hybrid organic/inorganic dielectric solution on the charge trapping layer; curing the hybrid organic-inorganic dielectric solution on the charge trapping layer by UV light; curing the hybrid organic/inorganic dielectric solution thermally with a curing temperature in a range of 130° C. to 180° C. to form a hybrid organic/inorganic layer; and forming a gate electrode on the hybrid organic/inorganic layer.

The sol-gel derived organic-inorganic hybrid materials of the dielectric layer are nano-composite materials in which inorganic and organic components are intimately linked at the molecular scale by a covalent bond and nano-sized oligomers are well dispersed. The trap sites of the charge trapping layer directly relate to memory window which can be controlled by varying the density of nanoparticles. The memory transistor of the present invention exhibits a memory window of 4.2 V, long retention time (100 ks) with low operating voltage (<7 V).

BRIEF DESCRIPTION OF THE DRAWINGS

Embodiments of the present invention are described in more detail hereinafter with reference to the drawings, in which.

DETAILED DESCRIPTION OF PREFERRED EMBODIMENTS

In the following description, a memory device, and the corresponding embodiments of the fabrication methods are set forth as preferred examples. It will be apparent to those skilled in the art that modifications, including additions and/or substitutions, may be made without departing from the scope and spirit of the invention. Specific details may be omitted so as not to obscure the invention; however, the disclosure is written to enable one skilled in the art to practice the teachings herein without undue experimentation.

$Si/SiO_2$ core/shell nanostructures with sizes below 30 nm as trapping points in UV curable hybrid organic-inorganic gate dielectrics are presented in the present invention. Not only does the novelty of the present invention comes from fabricating high-quality hybrid organic/inorganic gate dielectric stacks by Sol-Gel process at low temperature but also incorporating the monolayer of high-density of Si nanoparticles (NPs) without obvious interface defects and keeping the high-quality of dielectric layers. In the present memory devices fabricated by solution process at low temperature, fixed-charge trapping points associated with as synthesized defects are successfully removed from dielectric layer and clear memory effects are demonstrated with trapping functions solely related to $Si/SiO_2$ core/shell nanostructures.

Figure 1A:
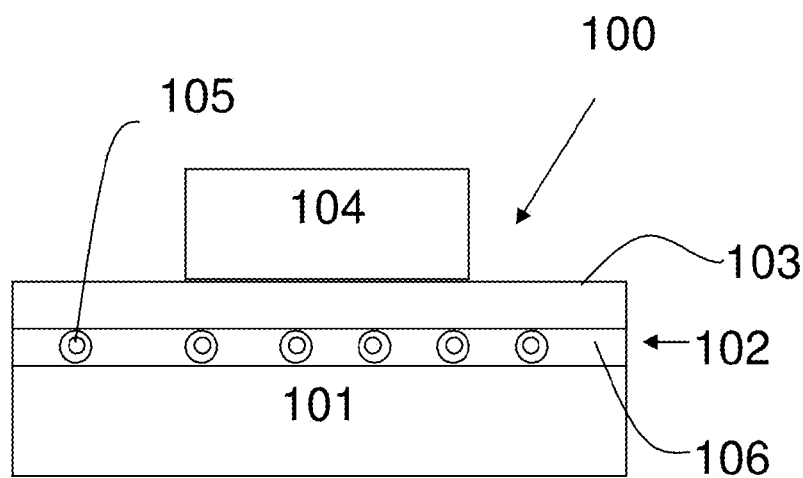
FIG. 1A shows a schematic diagram of a printable floating gate non-volatile memory device with $Si/SiO_2$ core/shell structures as charge trapping layer according to an embodiment of the presently claimed invention.
Figure 1B:
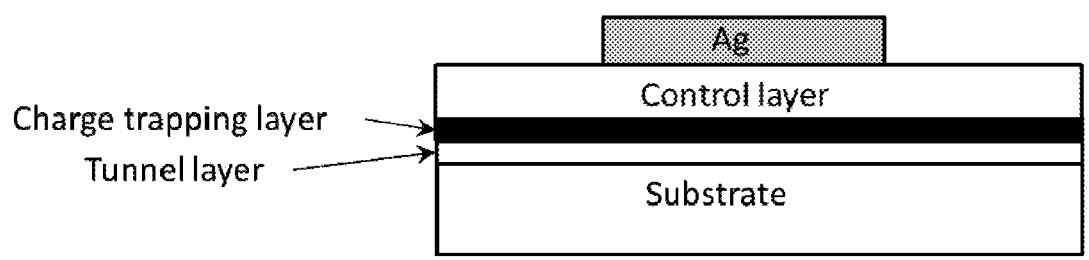
FIG. 1B shows a schematic structure of a traditional floating gate non-volatile memory device in a prior art.

As shown in FIG. 1A, a floating gate transistor 100 of the present invention comprises a Si substrate 101, a charge trapping comprising a plurality of $Si/SiO_2$ core/shell nanostructures 105 embedded within a hybrid organic/inorganic dielectric material 106, a hybrid organic/inorganic dielectric layer 103, and a gate electrode 104. The charge trapping layer 102 is formed on the Si substrate 101. The hybrid organic/inorganic dielectric layer 103, acting as a control layer for memory device, is formed on the charge trapping layer 102, and the gate electrode 104 is formed on the hybrid organic/inorganic dielectric layer 103. The $Si/SiO_2$ core/shell nanostructures 105 are located on the surface of the substrate 101. The charge trapping layer 102 comprises a monolayer of the $Si/SiO_2$ core/shell nanostructures 105. The hybrid organic/inorganic dielectric layer 103 comprises the same material as the hybrid organic/inorganic dielectric material 106. Typical gate stacks for traditional floating gate transistor include substrate/tunnel layer/charge trapping layer/control layer/gate electrode as shown in FIG. 1B [2, 3, 4, 5]. Normally, very thin oxide as tunnel layer for flash memory transistors must be fabricated by high temperature and/or, slow vacuum process [2, 5]. The present invention didn't involve separate fabrication of tunnel layer and it significantly simplifies the fabrication of flash gate transistors.

Preferably, the size of $Si/SiO_2$ core/shell nanostructures is in a range of 10 nm to 50 nm, and the thickness of the charge trapping layer is in a range of 10 nm to 50 nm since the trapping points are formed into a monolayer coating. The charge trapping layer comprises a density of the nanostructures in a range of $1 \times 10^{10}$ cm$^{-2}$ to $1 \times 10^{12}$ cm$^{-2}$. The $SiO_2$ shell with thickness of 3 nm to 5 nm functions as a tunnel layer in flash memory device in the present invention. Preferably, the thickness of the $SiO_2$ shell is 5 nm. The thickness of the dielectric layer is in a range of 300 nm to 800 nm.

Figure 2:
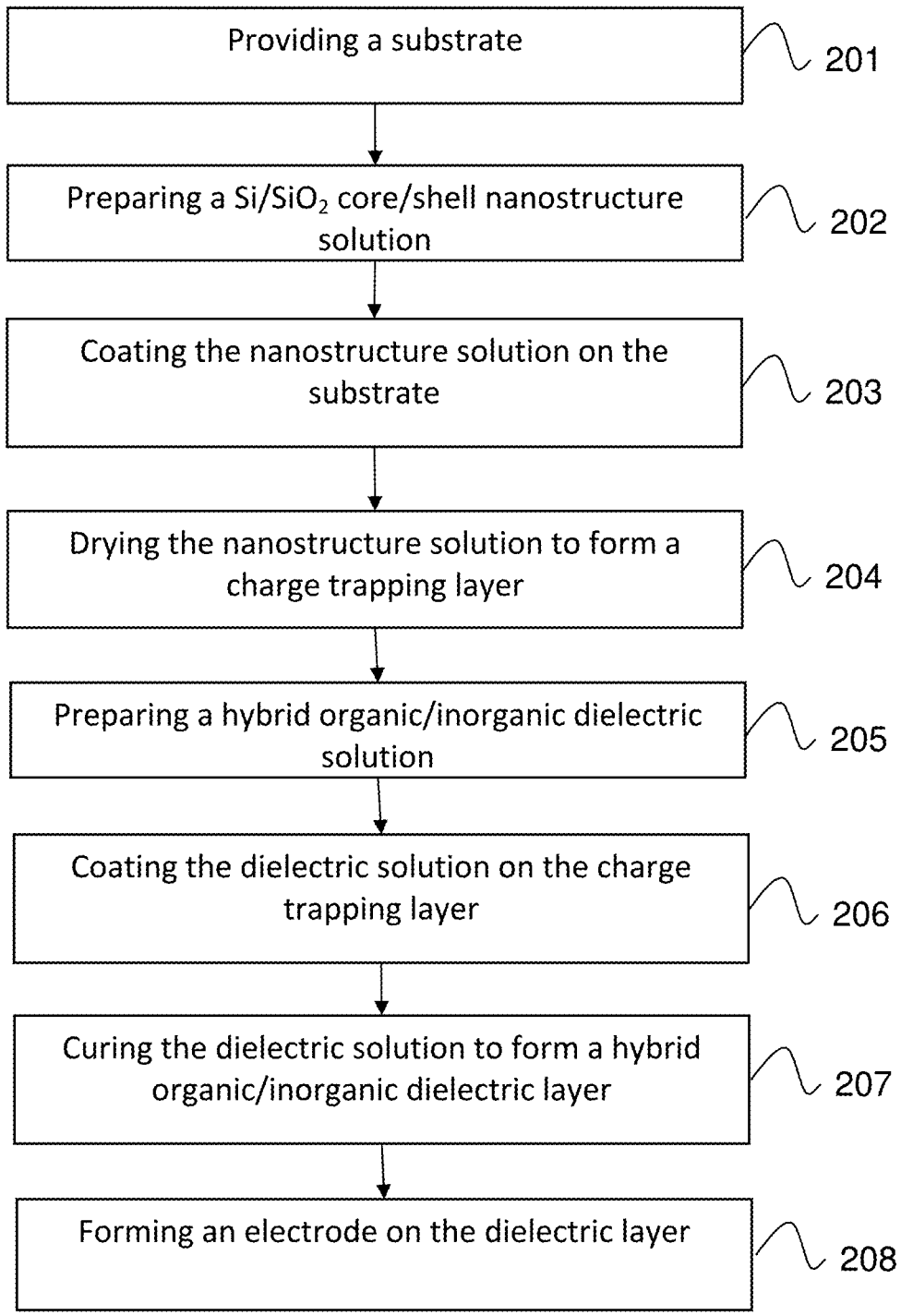
FIG. 2 shows a flow chart of a method for fabricating a non-volatile memory device according to an embodiment of the presently claimed invention.

FIG. 2 shows a flow chart of a method for fabricating of a non-volatile memory device according to an embodiment of the presently claimed invention. In step 201, a substrate is provided. In step 202, a $Si/SiO_2$ core/shell nanostructure solution is prepared. In step 203, the $Si/SiO_2$ core/shell nanostructure solution is coated on the substrate. In step 204, the $Si/SiO_2$ core/shell nanostructure solution is dried to form a charge trapping layer. In step 205, a hybrid organic/inorganic dielectric solution is prepared. In step 206, the hybrid organic/inorganic dielectric solution is coated on the charge trapping layer. In step 207, the hybrid organic/inorganic dielectric solution is cured to form a hybrid organic/inorganic dielectric layer with UV curing and thermal curing. In step 208, a gate electrode is attached on the dielectric layer.

The $Si/SiO_2$ core/shell nanostructure solution is prepared by mixing Si nanoparticles with ethanol and hydrogen peroxide. The average size of the Si nanoparticles is below 30 nm. This size (~30 nm) of NPs is able to be obtained with significantly higher production yield than quantum sizes of 1 nm to 5 nm. Also as proved in the present invention, 30 nm-NPs can form effective charge-trapping layer for non-volatile memory. Larger NPs (>50 nm) will challenge the film quality of followed hybrid dielectrics. The $Si/SiO_2$ core/shell nanostructure solution is coated on the substrate by dipping. The nanostructure solution can also be coated on the substrate by other methods, such as spray, doctor-blade, inkjet printing, or spin coating. Preferably, these nanostructures are coated on the substrate to form a monolayer for reducing charge leakage.

Preferably, the weight ratio of Si particles in the nanostructure solution may be in the range of 1% to 10%, dependent on what coating method is used. The solvents of Si NPs solution can include but not limited to Isopropanol, n-Propanol, Ethanol, Methanol, Acetone, etc. A volume ratio of $H_2O_2$ to the solvents is in the range of 5% to 20%.

The hybrid organic/inorganic dielectric solution is prepared by mixing 3-methacryloxypropyltrimethoxysilane (MEMO), zirconium propoxide (ZrPO) and methacrylic acid (MAA). The ratio of MEMO:ZrPO is related to hybrid composites of organics versus inorganics, preferred to be in the range of 7:3 or 6:4, to 5:5. The photoinitiator is added for UV curing to reduce the curing temperature for thermal curing to below 180° C. for high-quality hybrid dielectric layer.

The hybrid organic-inorganic dielectric solution is coated on the charge trapping layer by dip-coating, and then cured by UV and thermal curing at low temperature of 130° C. to 180° C. The sol-gel solution can also be coated on the charge trapping layer by other methods, such as spray, doctor-blade, inkjet printing, or spin coating.

UV curing is critical to fabricate high-quality hybrid dielectrics for floating gate memory. UV curing followed by low-temperature thermal curing will efficiently remove the fixed-charge defects in as-synthesized hybrid dielectrics. Pre-drying the hybrid organic-inorganic dielectric solution with a pre-drying temperature in a range of 60° C. to 150° C. can be performed before UV curing.

EXAMPLES

Example 1

The preferred embodiments for fabrication of Non-Volatile Memory devices with $Si/SiO_2$ core/shell nanostructures as charge trapping layer are shown as below. Lightly-doped silicon wafer with resistivity of 15-25 Ohm-cm was selected as substrate and then monolayer $Si/SiO_2$ core/shell nanostructures were coated as charge trapping layer. Afterwards, 0.5 um-1.0 um thick hybrid dielectrics layer was formed by dip coating as control layer. Eventually, top and bottom electrodes were formed by printing Ag paste. The device area was defined as 2 mm×2 mm.

Figure 3:
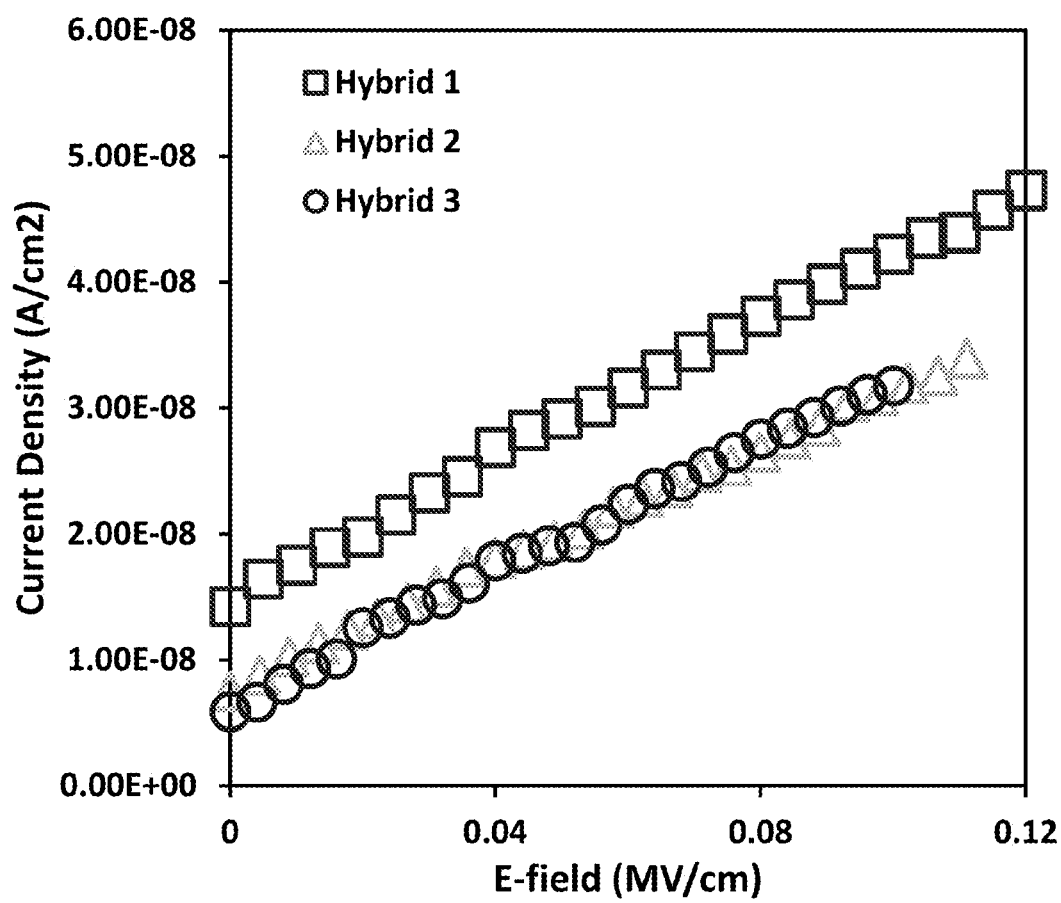
FIG. 3 is a graph showing leakage current density at different bias fields according to an embodiment of the presently claimed invention.

The organic-inorganic hybrid gate dielectric solution in this invention is synthesized by using sol-gel reactions between 3-methacryloxypropyltrimethoxysilane (MEMO), Zirconium propoxide (ZrPO) and methacrylic acid (MAA). With this organic/inorganic hybrid precursor solution, high-k dielectric layer can be obtained by dip-coating method to control the dielectric thickness. After UV curing and thermal curing, current densities passing through hybrid dielectric layers are relatively low as shown in FIG. 3, where Hybrid 1, 2, and 3 in FIG. 3 represent different samples in one batch.

Figure 4:
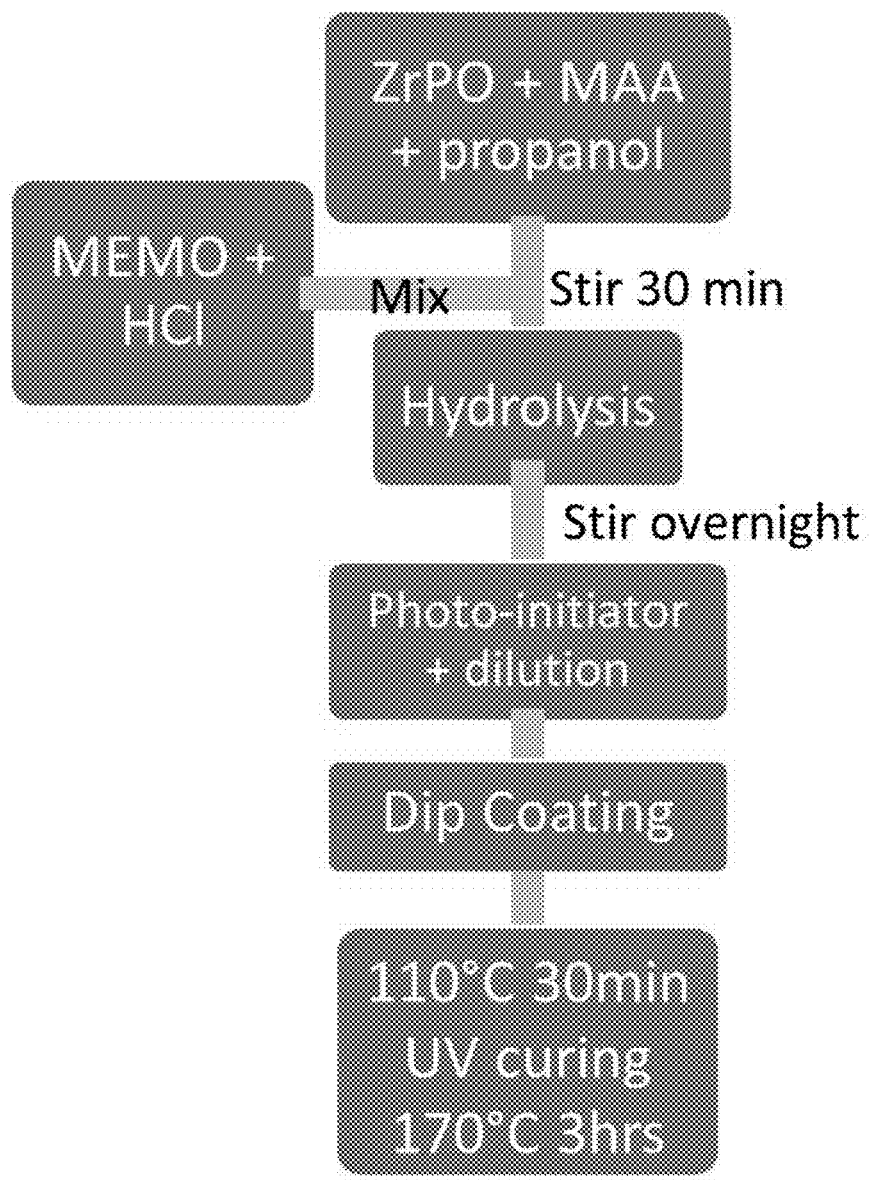
FIG. 4 is a flowchart showing process flow for preparing a hybrid Sol-Gel solution according to an embodiment of the presently claimed invention.

The process flow for Sol-Gel process of hybrid organic/inorganic dielectrics and dip coating is shown in FIG. 4. For example, 3-methacryloxypropyltrimethoxysilane (MEMO, 19.5 mmol) was first partially hydrolyzed with HCl as a catalyst. The pH value was controlled by HCl to enhance the hydrolysis. 10.5 mmol of each of Zirconium propoxide (ZrPO) and methacrylic acid (MAA) were mixed in 5 mL 1-propanol. After MEMO was stirred for 30 min, the two solutions were mixed. More DI water was added to facilitate the reaction. The molar ratio of MEMO:ZrPO:MAA:water was 6.5:3.5:3.5:18. The solution was sealed and stirred overnight, then added with 1 wt % photo-initiator 1-hydroxycyclohexylphenylketone (HCHPK) and diluted with 1-propanol to control the concentration. The solution was filtered with 0.22 um Millipore membrane. Afterwards, the solution was deposited on substrate (PET, glass, or Si wafer) by typical dip coater. Then, the coating was first pre-dried on a hotplate at 110° C. for 30 min. UV curing was performed with Dymax Bluewave 200 at 20 mW/cm$^2$ for 5 min. Lastly, thermal curing was done in a thermal oven at 170° C. for 3 h.

Figure 5A:
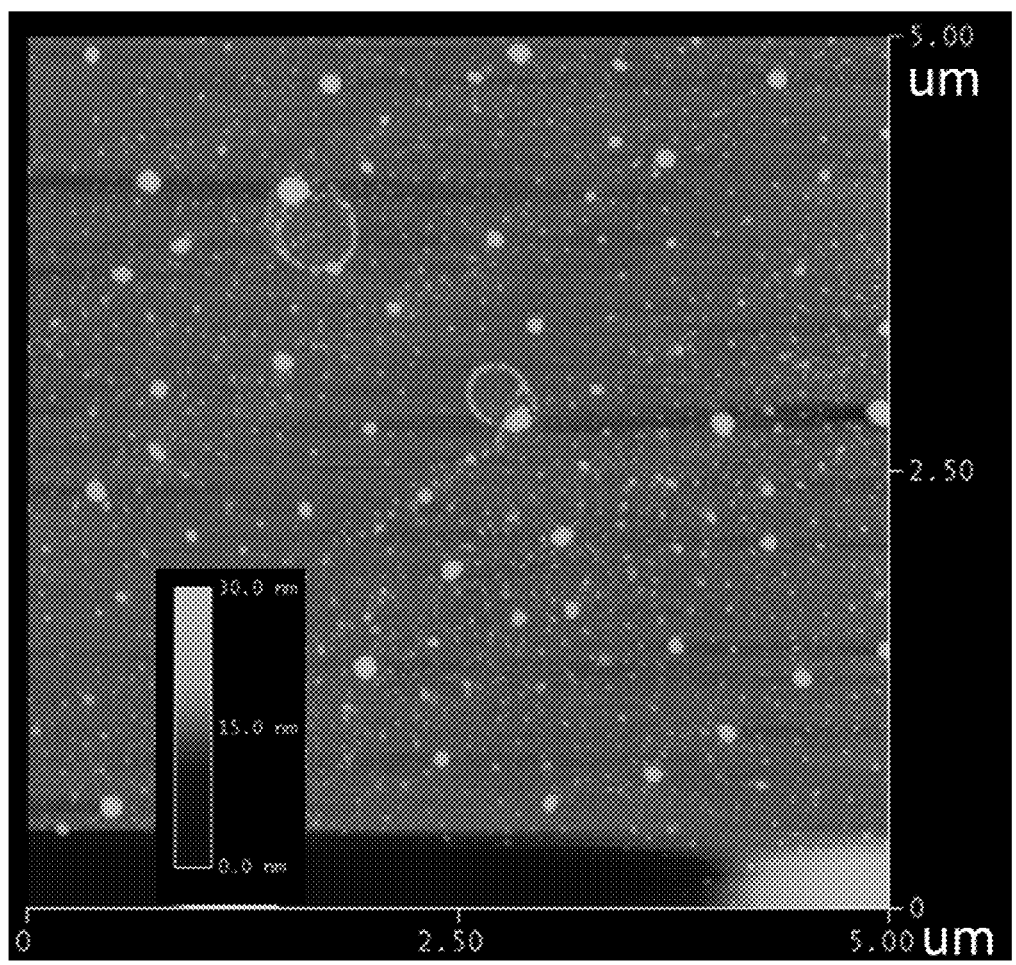
FIG. 5A is an atomic force microscopy AFM image of monolayer $Si/SiO_2$ core/shell structures coating according to an embodiment of the presently claimed invention.
Figure 5B:
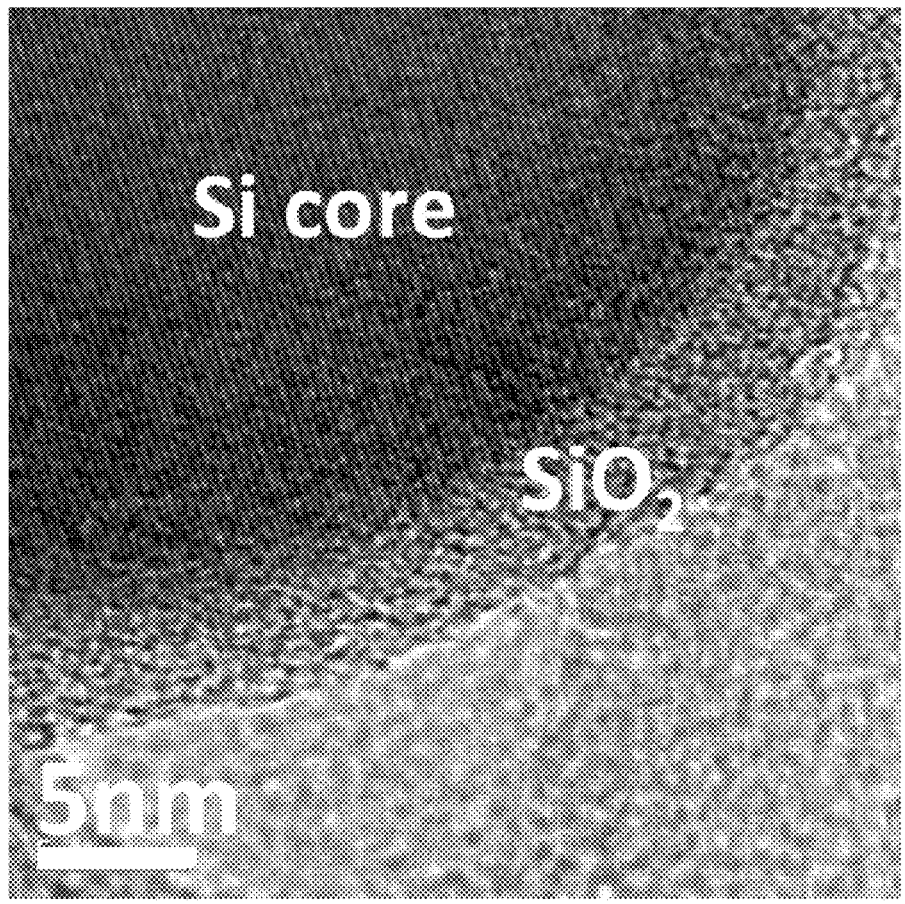
FIG. 5B is a TEM image of $Si/SiO_2$ core/shell structures with shell thickness of ~5 nm according to an embodiment of the presently claimed invention.

Si nanoparticles (NPs) can be easily oxidized in an ethanol (EtOH)/H$_2$O$_2$ solution to form Si/SiO$_2$ core/shell structures. These nanostructures with average size of <30 nm were dispersed into ethanol solution and coated on substrate by dipping. Typical monolayer coating is shown in FIG. 5A under atomic force microscopy (AFM). High-resolution transmission electron microscopy (TEM) image in FIG. 5B showed the SiO$_2$ shell is ~5 nm in thickness.

Figure 6:
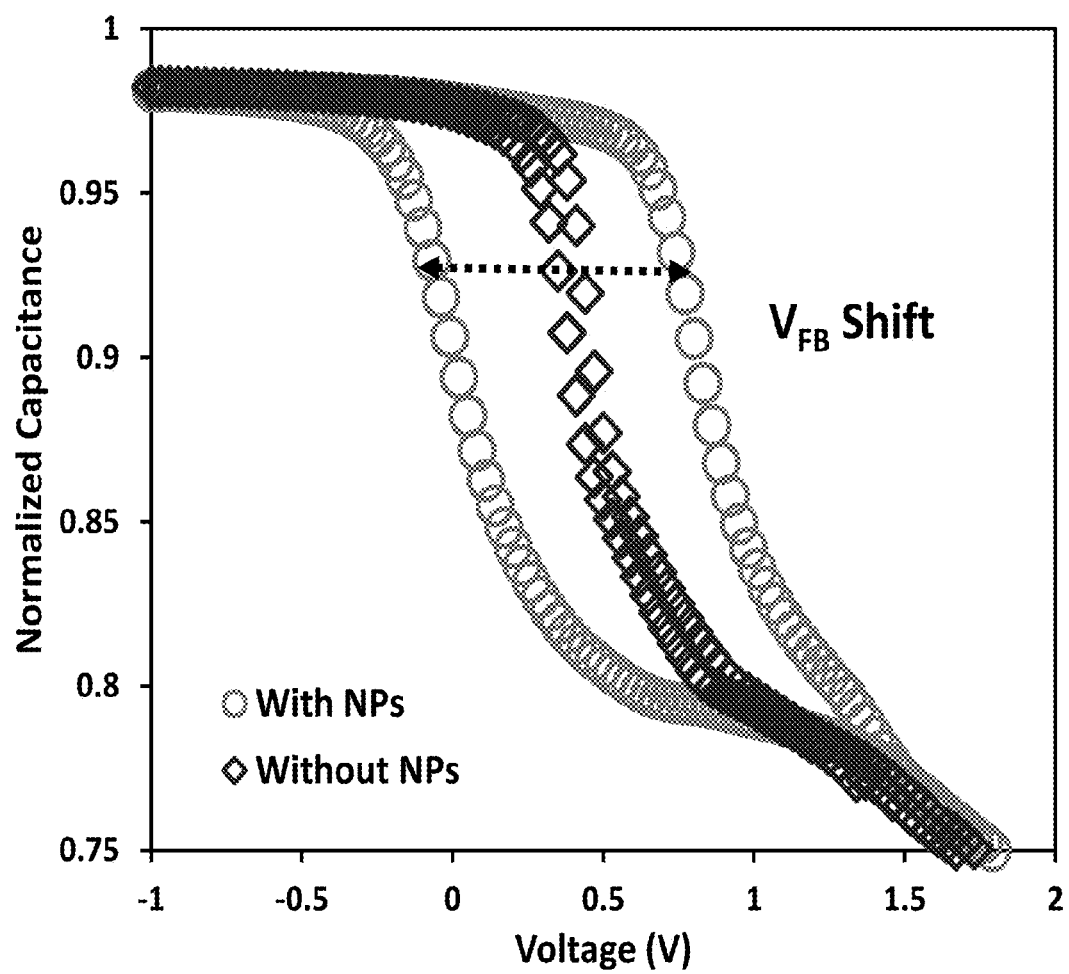
FIG. 6 is a graph showing memory effects of $Si/SiO_2$ core/shell structures according to an embodiment of the presently claimed invention.
Figure 7A:
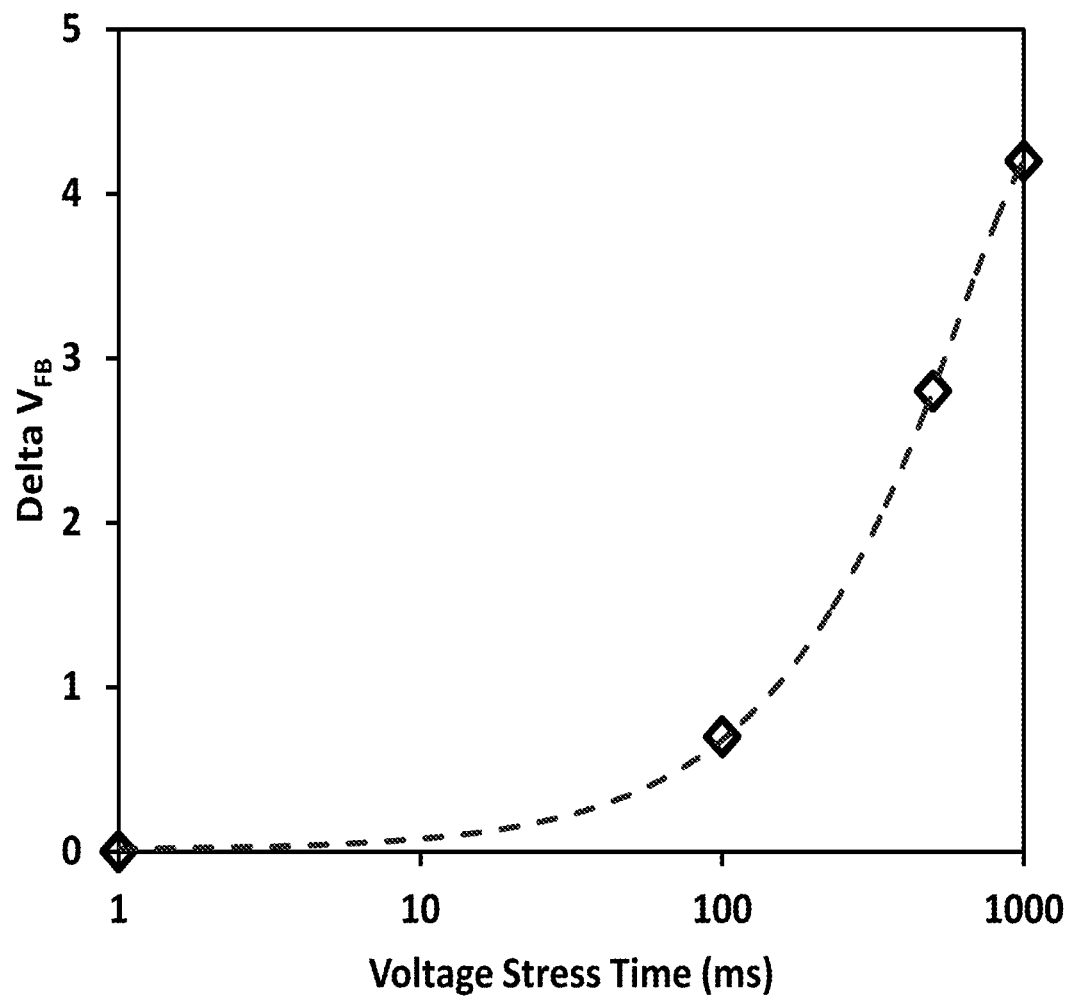
FIG. 7A is a graph showing memory behavior tuned via varying the voltage stress time according to an embodiment of the presently claimed invention.
Figure 7B:
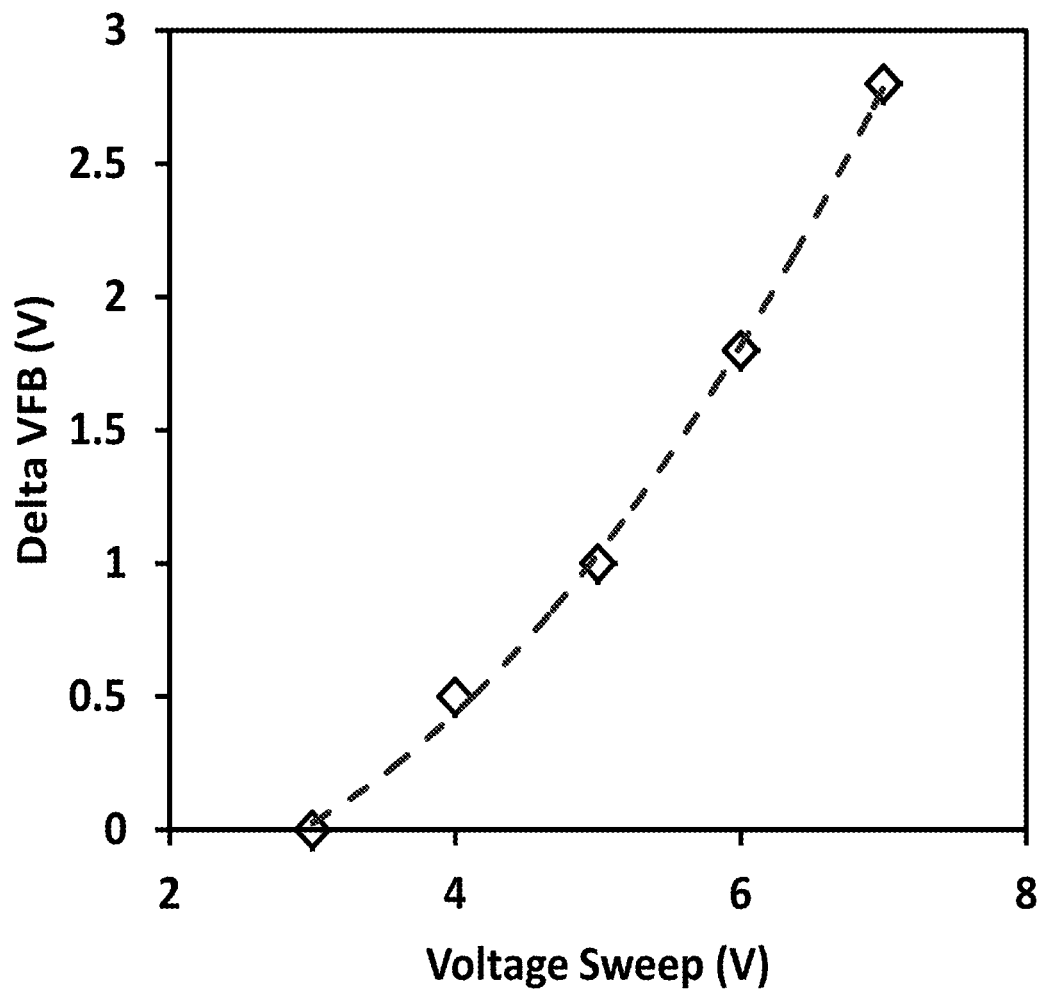
FIG. 7B is a graph showing memory behavior tuned via varying the stress voltage amplitude according to an embodiment of the presently claimed invention.

The memory behavior as shown in FIG. 6 was clearly observed to come from mobile charging/discharging solely related to Si/SiO$_2$ core/shell nanostructures on the charge trapping layer. Regarding the capacitance versus voltage (CV) characterization of samples without Si nanostructures, its charge trapping layer didn't show any hysteresis, indicating high-quality hybrid dielectrics without any fixed-charge defects. The memory window (the width of CV loop) has been tuned via varying the voltage stress time (FIG. 7A) and the stress voltage amplitude (FIG. 7B), which offers relatively easy control ability for different flexible electronics applications.

Figure 8:
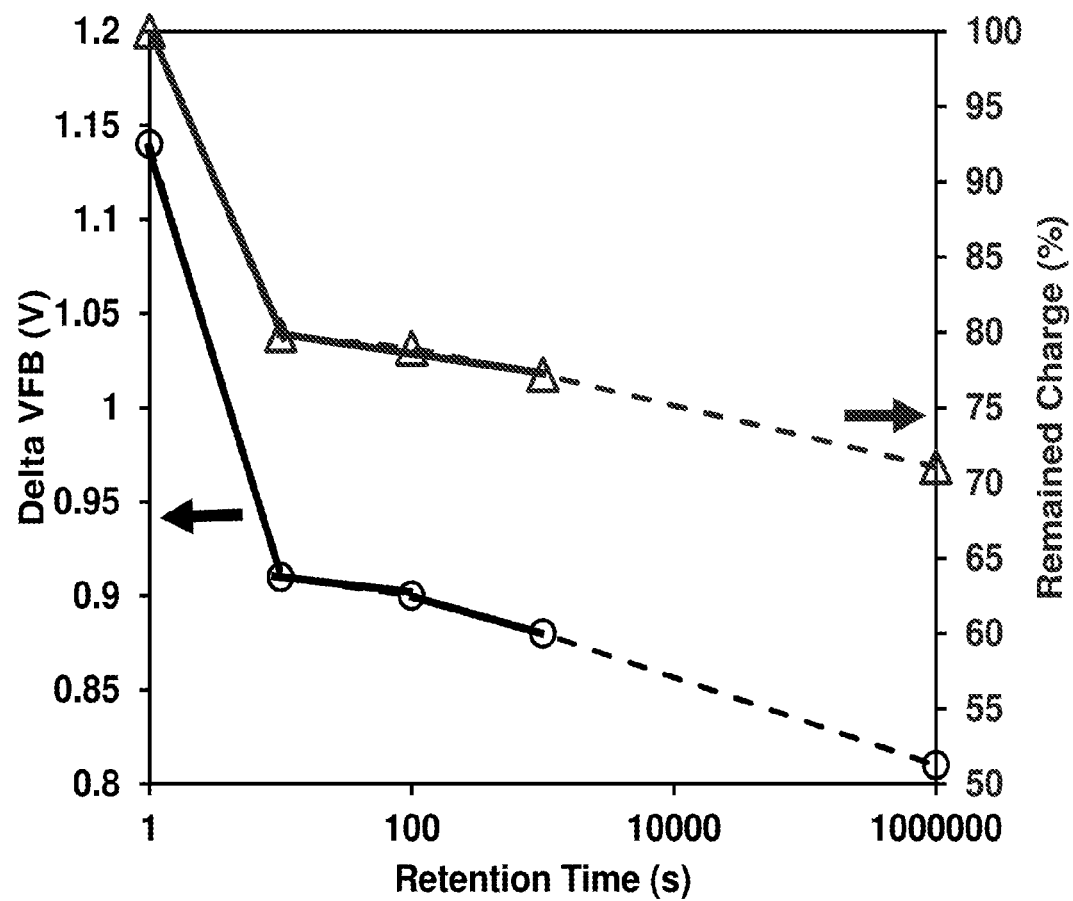
FIG. 8 is a graph showing retention properties of memory based on $Si/SiO_2$ core/shell NPs according to an embodiment of the presently claimed invention.

Although nano-floating gate transistor memory based on Si/SiO$_2$ core/shell NPs drives voltage not larger than 10V, memory window remained 75% after 10$^4$ s program/erase (P/E) tests with P/E speed within 75 ms as shown in FIG. 8.

Example 2

In order to optimize sol-gel process for high-quality hybrid dielectric layer, below samples for different hybrid dielectrics were investigated as shown in Table 1. All samples use the same device structures as Example 1. Loops of capacitance versus voltage (CV) were measured for these devices under different time of voltage stress at gate. The pulse width time of applied voltage stress can change the width of CV loops during memory charging/discharging process. However, if there are dominant fixed charge defects in dielectrics, the charging/discharging process of memory devices will be screened and the width of CV loops will become insensitive to voltage stress time [7].

TABLE 1

Investigation of hybrid dielectrics for nano floating gate memory devices

| Samples | Formula | UV cure | Thermal Cure |
|---|---|---|---|
| 1 | MEMO:ZrPO = 6.5:3.5 | 20 mW/cm$^2$, 5 min | 170° C., 3 h |
| 2 | MEMO:ZrPO = 8:2 | 20 mW/cm$^2$, 5 min | 170° C., 3 h |
| 3 | MEMO:ZrPO = 6.5:3.5 | NO | 170° C., 3 h |
| 4 | TiO$_2$ NPs dispersed in PMMA | NO | 170° C., 3 h |

Figure 9A:
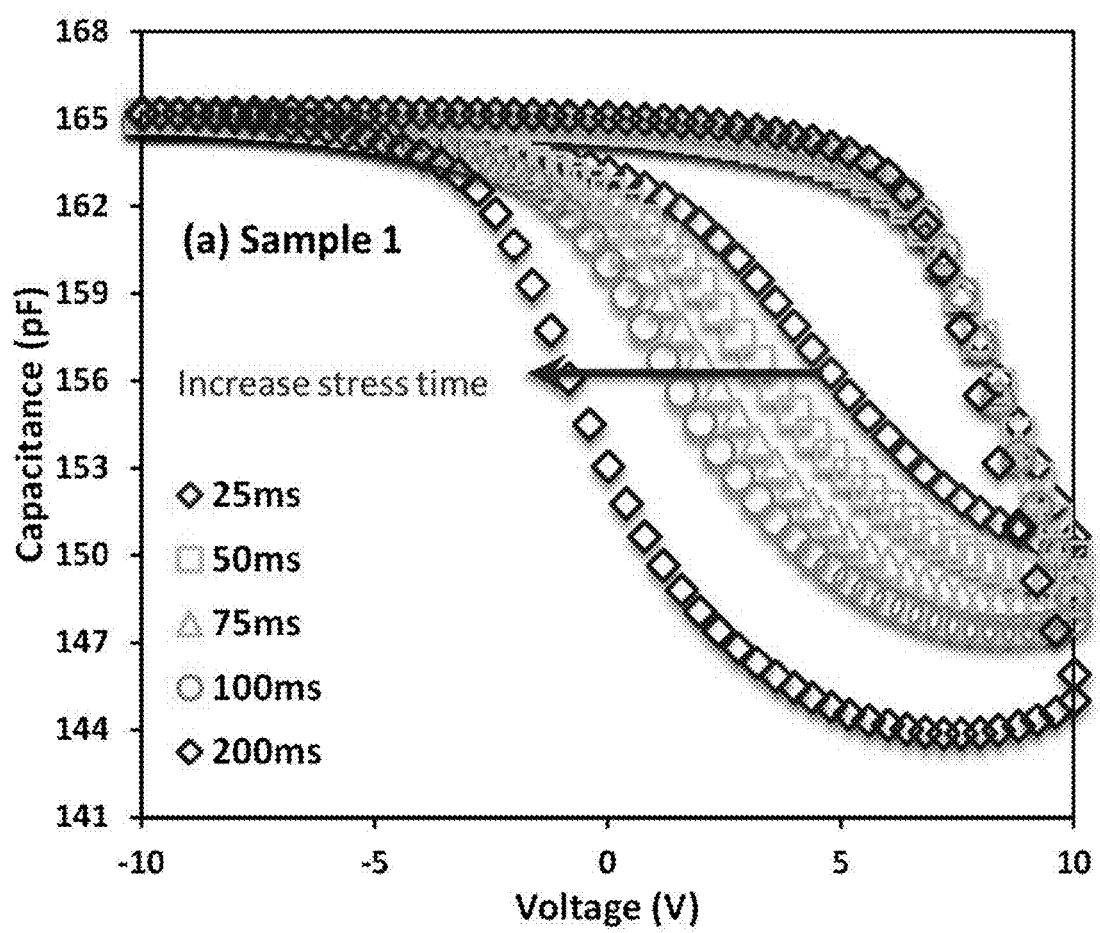
FIGS. 9A-D are CV loops measured under different voltage stress time for samples 1, 2, 3, and 4 respectively according to an embodiment of the presently claimed invention.
Figure 9B:
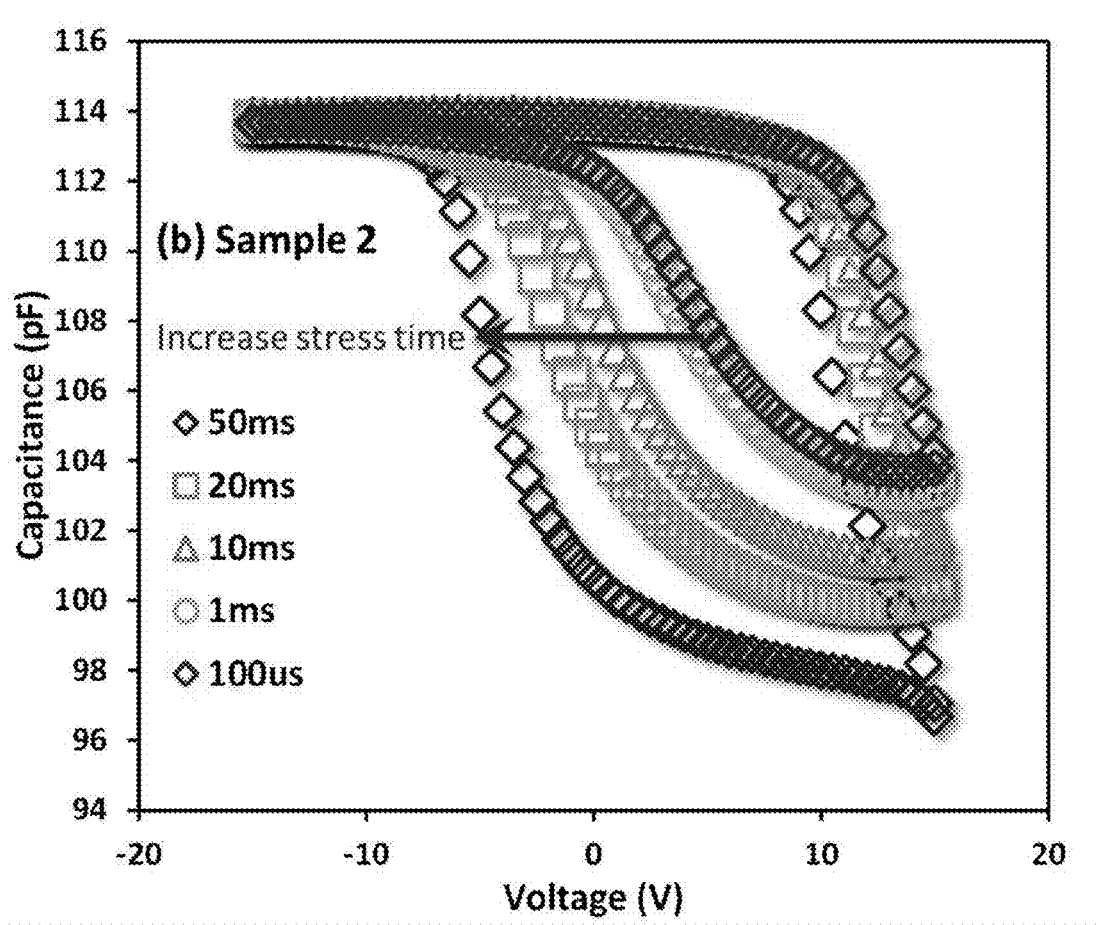

Sample 1 is similar to the sample in Example 1 and it is cured by UV 20 mW/cm$^2$, 5 min followed by thermal curing with 170° C., 3 h. Sample 2 incorporates fewer ZrPO into dielectrics and is also cured by 20 mW/cm$^2$, 5 min and 170° C., 3 h. From CV loops under different voltage stress time for both sample 1 (FIG. 9A) and sample 2 (FIG. 9B), loop width significantly increases with longer stress time. This is a typical charging/discharging process by trapping layers in memory device. There are fewer high-k components of ZrPO in sample 2. So the flat-band capacitance of sample 2 is ~114 pF, a little bit lower than 165 pF of sample 1.

Figure 9C:
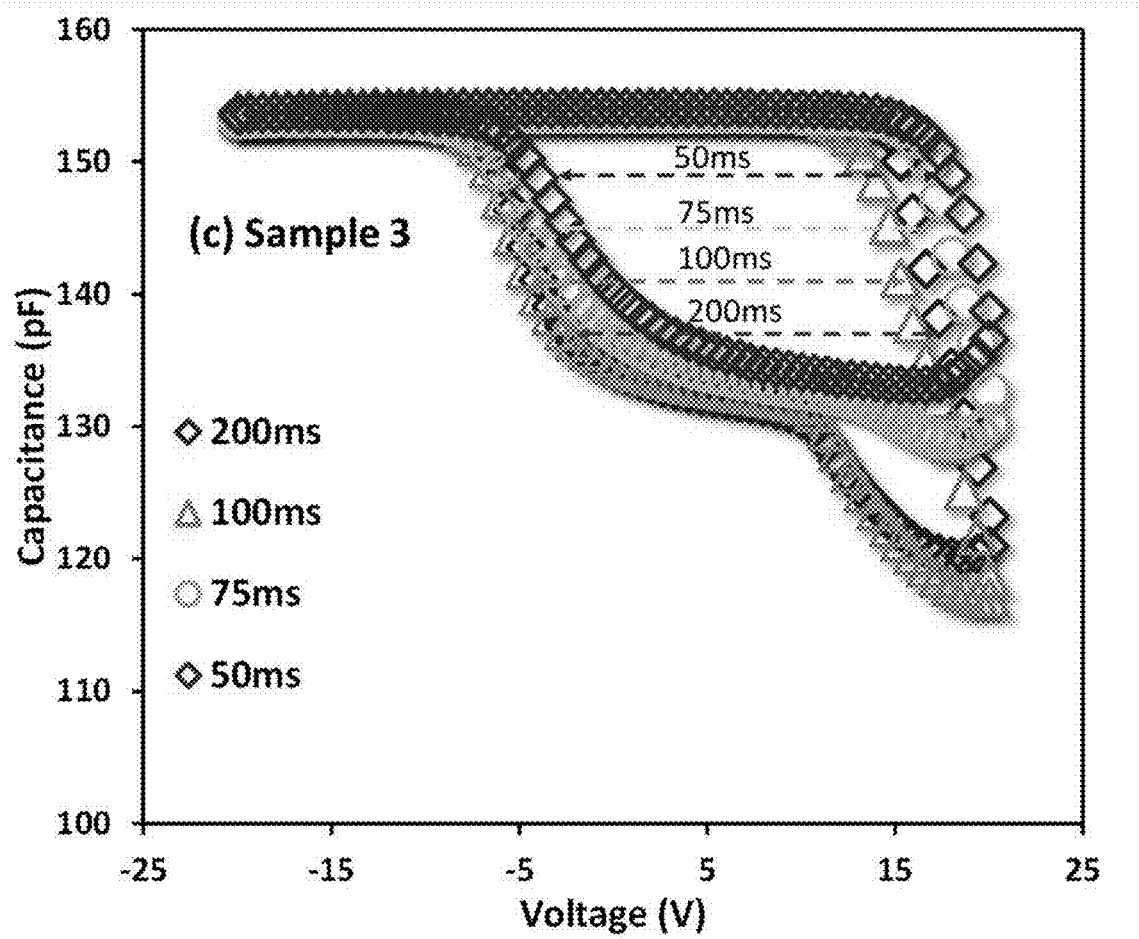

However, sample 3 without UV curing may indicate some fixed defects in dielectrics and it involved some —OH groups with hybrid materials [8]. Its CV loops stay insensitive to voltage stress time as shown in FIG. 9C. UV light irradiation should be very critical to form good crosslinks at molecular scale between inorganic (high-k) and organic components. Comparing sample 1 with sample 3, the high-intensity UV light may inhibit the formation of —OH group efficiently. Benefiting from improved sol-gel formula and more powerful UV light, hybrid dielectrics in Sample 1 shows better performance than that case in ref. [8]. Then this high-quality hybrid dielectrics can meet stringent requirements for non-volatile memory devices.

Figure 9D:
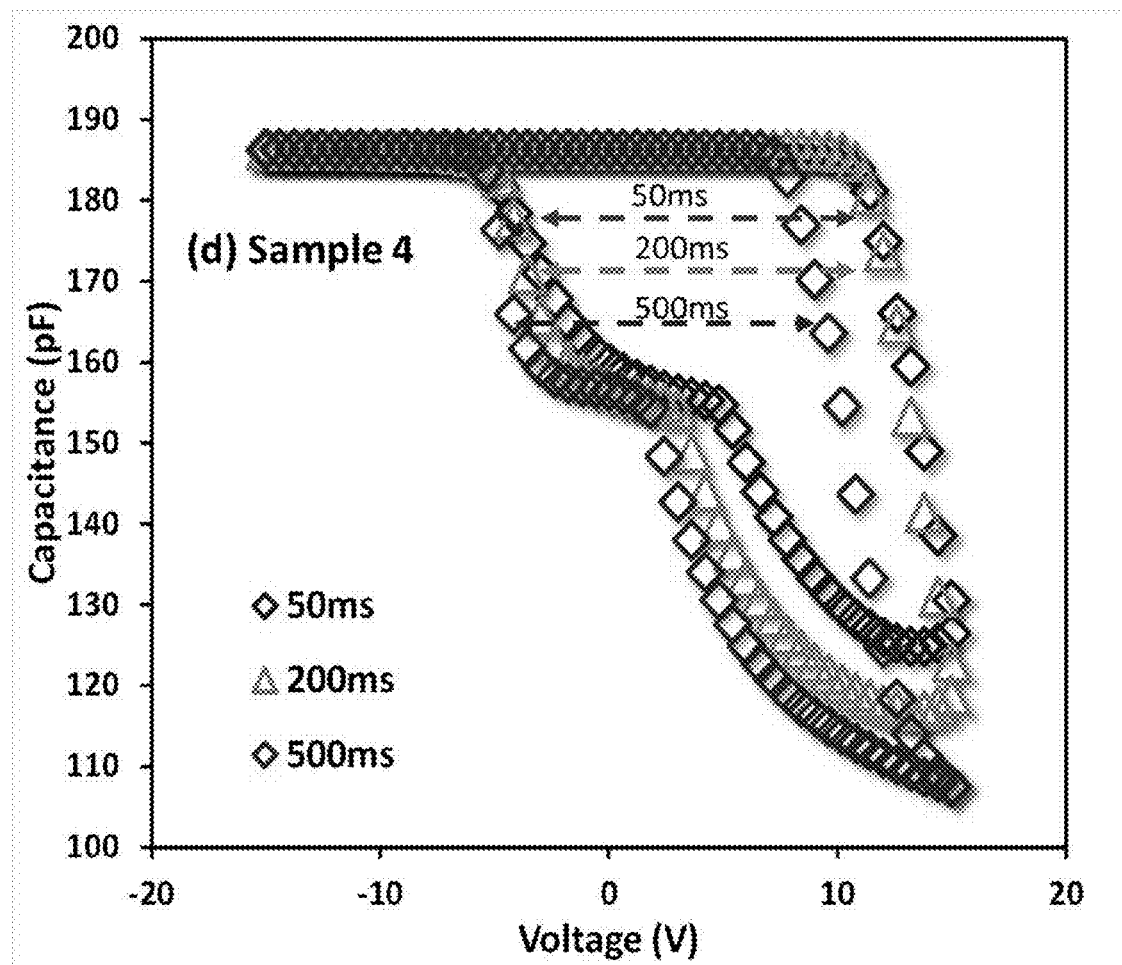

As additional reference, in sample 4 TiO$_2$ NPs were dispersed into PMMA and fabricated into memory devices as dielectric layer. The evolution of CV loops under voltage stress time for sample 4 is shown in FIG. 9D. Loop width didn't become sensitive to stress time even though the pulse of 500 ms was applied on gate. There should be strongly fixed-charge defects in dielectrics of sample 4 and be related to interfacial defects on TiO$_2$ NPs to PMMA. Inorganic NPs blended in polymer matrix act as charged centers has been described in [8] and these fixed charges in dielectrics will deteriorate charge-trapping-layer for floating gate memory structures.

This hybrid dielectrics of the present invention can also find critical applications in other thin-film transistors, or nano floating gate transistors, or planar floating gate transistors.

These Si/SiO$_2$ core/shell nanostructures of the present invention can also act as superior charge trapping points in resistive switching memory device (named as memoristor) as in ref. [9].

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:
1. A floating gate memory device, comprising:
   a substrate;
   a charge trapping layer formed on the substrate, wherein the charge trapping layer comprises a hybrid organic/inorganic dielectric material and silicon/silicon dioxide (Si/SiO$_2$) core/shell nanostructures, and the Si/SiO$_2$ core/shell nanostructures are embedded within the hybrid organic/inorganic dielectric material;
   a hybrid organic/inorganic dielectric layer formed on the charge trapping layer; and
   a gate electrode formed on the hybrid organic/inorganic layer; and wherein each of the Si/SiO$_2$ core/shell nanostructures comprises a Si core enclosed by a SiO$_2$ shell acting as a tunnel layer for the floating gate memory device.

2. The device of claim 1, wherein the Si/SiO$_2$ core/shell nanostructures comprises a size of 10 nm to 50 nm and the SiO$_2$ shell comprise a thickness of 3 nm to 5 nm.

3. The device of claim 1, wherein the Si/SiO$_2$ core/shell nanostructures comprises a size of 30 nm.

4. The device of claim 1, wherein the charge trapping layer comprises a density of Si/SiO$_2$ core/shell nanostructures in a range of $1 \times 10^{10}$ cm$^{-2}$ to $1 \times 10^{12}$ cm$^{-2}$.

5. The device of claim 1, wherein the charge trapping layer comprises a thickness in a range of 10 nm to 50 nm.

6. The device of claim 1, wherein the charge trapping layer comprises a monolayer of the Si/SiO$_2$ core/shell nanostructures.

7. The device of claim 1, wherein the hybrid organic/inorganic layer is formed from methacryloxypropyltrimethoxysilane, zirconium and methacrylic acid.

8. The device of claim 1, wherein the hybrid organic/inorganic layer comprises a thickness in a range of 300 nm to 800 nm.

9. A method for fabricating the floating gate memory device of claim 1, comprising:
providing a substrate;
mixing silicon particles with a solution comprising ethanol and hydrogen peroxide (H$_2$O$_2$) to form a silicon/silicon dioxide (Si/SiO$_2$) core/shell nanostructures solution, wherein the silicon particles comprises a size of 10 nm to 50 nm, the silicon particles comprises a weight ratio of 1% to 10% of the Si/SiO$_2$ core/shell nanostructures solution, and a volume ratio of the ethanol to the H$_2$O$_2$ is in a range of 5% to 20%;
coating the Si/SiO$_2$ core/shell nanostructure solution on the substrate;
drying the Si/SiO$_2$ core/shell nanostructure solution with a drying temperature in a range of 60° C. to 80° C. to form a charge trapping layer;
mixing 3-methacryloxypropyltrimethoxysilane (MEMO), zirconium propoxide (ZrPO), methacrylic acid (MAA), and a photoinitiator to form a hybrid organic/inorganic dielectric solution, wherein a volume ratio of the MEMO to the ZrPO is in a range of 7:3 to 5:5;
coating the hybrid organic/inorganic dielectric solution on the charge trapping layer;
pre-drying the hybrid organic-inorganic dielectric solution with a pre-drying temperature in a range of 60° C. to 150° C.;
curing the hybrid organic-inorganic dielectric solution on the charge trapping layer by UV light;
curing the hybrid organic/inorganic dielectric solution thermally with a curing temperature in a range of 130° C. to 180° C. to form a hybrid organic/inorganic layer; and
forming a gate electrode on the hybrid organic/inorganic layer.

10. A method for fabricating the floating gate memory device of claim 1, comprising:
providing a substrate;
mixing silicon particles with a solution comprising an organic solvent and hydrogen peroxide to form a silicon/silicon dioxide (Si/SiO$_2$) core/shell nanostructures solution, wherein the silicon particles comprises a size of 10 nm to 50 nm;
coating the Si/SiO$_2$ core/shell nanostructure solution on the substrate;
drying the Si/SiO$_2$ core/shell nanostructure solution with a drying temperature in a range of 60° C. to 150° C. to form a charge trapping layer;
mixing 3-methacryloxypropyltrimethoxysilane (MEMO), zirconium propoxide (ZrPO), methacrylic acid (MAA), and a photoinitiator to form a hybrid organic/inorganic dielectric solution, coating the hybrid organic/inorganic dielectric solution on the charge trapping layer;
curing the hybrid organic-inorganic dielectric solution on the charge trapping layer by UV light;
curing the hybrid organic/inorganic dielectric solution thermally with a curing temperature in a range of 130° C. to 180° C. to form a hybrid organic/inorganic layer; and
forming a gate electrode on the hybrid organic/inorganic layer.

11. The method of claim 10, wherein the silicon particles comprises a size of 30 nm.

12. The method of claim 10, wherein the silicon particles comprises a weight ratio of 1% to 10% of the Si/SiO$_2$ core/shell nanostructures solution.

13. The method of claim 10, wherein the organic solvent is isopropanol, n-propanol, ethanol, methanol, or acetone.

14. The method of claim 10, wherein a volume ratio of the organic solvent to the H$_2$O$_2$ is in a range of 5% to 20%.

15. The method of claim 10, wherein a volume ratio of the MEMO to the ZrPO is in a range of 7:3 to 5:5.

16. The method of claim 10, wherein the drying temperature is in a range of 60° C. to 80° C.

17. The method of claim 10, wherein the step of mixing the MEMO, the ZrPO, the MAA and the photoinitiator to form the hybrid organic/inorganic dielectric solution further comprises:
hydrolyzing the MEMO with hydrochloric acid (HCL) to form a first solution;
mixing the ZrPO, the MAA and propanol to form a second solution;
mixing the first solution, the second solution and water to from a third solution;
adding 1-hydroxycyclohexylphenylketone (HCHPK) as the photoinitiator into the third solution; and
diluting the third solution with the HCHPK with 1-propanol.

18. The method of claim 17, wherein the third solution comprises a molar ratio of the MEMO:the ZrPO:the MAA:the water with 6.5:3.5:3.5:18.

19. The method of claim 10, wherein the Si/SiO$_2$ core/shell nanostructure solution is coated on the substrate by dipping, and the hybrid organic/inorganic dielectric solution is coated on the charge trapping layer by dipping.

20. The method of claim 10, further comprising pre-drying the hybrid organic-inorganic dielectric solution with a pre-drying temperature in a range of 60° C. to 150° C. before the step of curing by UV light.

* * * * *